United States Patent [19]

Kang et al.

[11] Patent Number: 5,796,638

[45] Date of Patent: Aug. 18, 1998

[54] METHODS, APPARATUS AND COMPUTER PROGRAM PRODUCTS FOR SYNTHESIZING INTEGRATED CIRCUITS WITH ELECTROSTATIC DISCHARGE CAPABILITY AND CONNECTING GROUND RULES FAULTS THEREIN

[75] Inventors: Sung-Mo Steve Kang, Champaign, Ill.; Charvaka Duvvury, Plano, Tex.; Carlos Hernando Diaz, Mountain View, Calif.; Sridhar Ramaswamy, Champaign, Ill.

[73] Assignees: The Board of Trustees of the University of Illinois, Urbana, Ill.; Texas Instruments Incorporated, Dallas, Tex.; Hewlett-Packard Company, Palo Alto, Calif.

[21] Appl. No.: 668,856

[22] Filed: Jun. 24, 1996

[51] Int. Cl.⁶ .................................................... G06F 17/50
[52] U.S. Cl. .......................... 364/578; 364/489; 364/483
[58] Field of Search .................................. 364/488, 489, 364/578, 483; 257/355, 358, 370; 437/51, 59, 34

[56] References Cited

U.S. PATENT DOCUMENTS

| | | | |
|---|---|---|---|
| 4,692,781 | 9/1987 | Rountree et al. | 357/23.13 |
| 4,825,107 | 4/1989 | Naganuma et al. | 307/465 |
| 4,893,168 | 1/1990 | Takahashi et al. | 357/68 |
| 4,952,994 | 8/1990 | Lin | 357/23.13 |
| 5,051,860 | 9/1991 | Lee et al. | 361/58 |
| 5,166,089 | 11/1992 | Chen et al. | 437/51 |
| 5,229,635 | 7/1993 | Bessolo et al. | 257/360 |
| 5,237,395 | 8/1993 | Lee | 257/358 |
| 5,270,565 | 12/1993 | Lee et al. | 257/358 |
| 5,290,724 | 3/1994 | Leach | 437/51 |
| 5,404,041 | 4/1995 | Diaz et al. | 257/360 |
| 5,450,267 | 9/1995 | Diaz et al. | 361/56 |
| 5,461,576 | 10/1995 | Tsay et al. | 364/490 |
| 5,468,667 | 11/1995 | Diaz et al. | 437/50 |
| 5,616,943 | 4/1997 | Nguyen et al. | 257/355 |
| 5,631,793 | 5/1997 | Ker et al. | 361/56 |
| 5,648,910 | 7/1997 | Ito | 364/900 |
| 5,689,432 | 11/1997 | Blaauw et al. | 364/490 |
| 5,691,910 | 11/1997 | Thodiyil | 364/483 |

OTHER PUBLICATIONS

Soohoo et al., "ESD Protective I/O Serpentine Block Design," IEEE, 1991, pp. 261–262.

Lowther et al., "Fast, Quan-3D Modeling of Base Resistance for Circuit Simulation," IEEE, 1991, pp. 518–526.

*Primary Examiner*—Kevin J. Teska
*Assistant Examiner*—Thai Phan
*Attorney, Agent, or Firm*—Myers Bigel Sibley & Sajovec, P.A.

[57] ABSTRACT

A method, apparatus and computer program product for synthesizing and correcting ESD and EOS ground rules faults in integrated circuits generates a representation of a first functional circuit element (e.g., logic gate) connected to a representation of a first input/output (I/O) pad, via a representation of a first electrical path, and generates a representation of a first ESD circuit element connected to the representation of the first input/output pad via a representation of a second electrical path which may overlap a portion of the first electrical path. First and second sheet resistances (or quantities related thereto) of the first and second electrical paths, respectively, are determined and a length and/or width of the representation of at least one of the first and second electrical paths is adjusted if the first sheet resistance is greater than the second sheet resistance, so that the first sheet resistance is less than the second sheet resistance. Corners in representations of adjacent power rails are also detected, where these representations have opposing edges separated by a minimum rail spacing, and a position of at least one of the power rails relative to the other is adjusted so that the opposing edges are separated by a spacing which is no less than about two times the minimum rail spacing.

5 Claims, 4 Drawing Sheets

METHODS, APPARATUS AND COMPUTER PROGRAM PRODUCTS FOR SYNTHESIZING INTEGRATED CIRCUITS WITH ELECTROSTATIC DISCHARGE CAPABILITY AND CONNECTING GROUND RULES FAULTS THEREIN

FIELD OF THE INVENTION

This invention relates to the design, layout, testing and manufacture of integrated circuits and systems, and more particularly to apparatus and methods for facilitating automated layout of integrated circuits.

BACKGROUND OF THE INVENTION

The large capital investment required to fabricate and test integrated circuit devices prior to sale to a customer and the difficulty, expense and loss of goodwill associated with reworking and replacing integrated circuit devices which fail in the field have emphasized the need for automated methods of designing and correcting integrated circuit layouts to be free of electrostatic discharge and electrical overstress ground rules faults. Such faults account for more than fifty (50) percent of the field related failures in integrated circuits.

In particular, electrostatic discharge (ESD) and electrical overstress (EOS) protection circuitry plays an important role in the design, layout and testing of integrated circuits (IC) because many of the functional circuit elements on state-of-the-art integrated circuits are susceptible to high voltages caused by, among other things, electrostatic build-up of charge. This is especially true for complementary metal oxide semiconductor (CMOS) based integrated circuits because in high density CMOS circuits, high voltages caused by electrostatic build-up can destroy gate oxides associated with individual transistors and logic gates, etc. To protect against these types of failures, many attempts have been made to develop ESD and EOS protection devices. One such attempt is disclosed in U.S. Pat. No. 4,692,781 to Rountree et al. entitled *Semiconductor Device with Electrostatic Discharge Protection*, assigned to Texas Instruments, Inc. The '781 patent discloses an input protection circuit containing a thick-oxide transistor connected between a metal I/O pad and ground. The spacing between the metal-to-silicon drain contact and the channel of this transistor is made large so that the metal drain contact will not be melted by heat propagated along the silicon surface during a current spike caused by an ESD event. U.S. Pat. No. 4,952,994 to Lin entitled *Input Protection Arrangement for VLSI Integrated Circuit Devices*, assigned to Digital Equipment Corp., also discloses an input protection circuit for diverting electrostatic discharge current away from functional circuit elements which are connected to I/O pads on an integrated circuit chip. The input protection circuit comprises a MOS transistor having a gate electrode and a field oxide insulating layer capable of sustaining high voltages.

Other attempts to develop ESD/EOS protection circuits are also disclosed in U.S. Pat. Nos. 5,404,041, 5,450,267 and 5,468,667 to C. H. Diaz, C. Duvvury and S. M. Kang. In particular, the '041 and '667 patents disclose MOS-type ESD/EOS protection devices with source and drain contact spacings that are designed to increase the failure threshold of the protection devices. In addition, the '267 patent discloses an ESD/EOS protection circuit including both MOS and bipolar transistors.

However, notwithstanding the recognition of the problem of electrostatic discharge and electrical overstress faults and the many attempts to inhibit integrated circuit failure resulting therefrom using conventional ESD/EOS protection circuits, there continues to be a need for a method, apparatus and computer program product for insuring the proper placement of such protection circuits on an entire integrated circuit chip and correcting ESD/EOS ground rules faults detected therein, prior to manufacture of the integrated circuits.

SUMMARY OF THE INVENTION

It is therefore an object of the present invention to provide a method, apparatus and computer program product for synthesizing computer readable representations of integrated circuits having electrostatic discharge protection circuit elements therein.

It is another object of the present invention to provide a method, apparatus and computer program product for correcting electrostatic discharge and electrical overstress ground rules faults in computer readable representations of integrated circuits.

It is further object of the present invention to provide a method, apparatus and computer program product for adjusting placement of electrostatic discharge protection circuit elements to correct electrostatic discharge ground rules faults.

It is still a further object of the present invention to provide a method, apparatus and computer program product for adjusting placement of power rails of an integrated circuit to correct electrical overstress ground rules faults.

These and other objects are provided, according to the present invention, by a method, apparatus and computer program product for synthesizing computer readable representations of integrated circuits having electrostatic discharge protection circuit elements therein and also correcting electrostatic discharge (ESD) and electrical overstress (EOS) ground rules faults in the computer readable representations. These computer readable representations can be synthesized and corrected using a general purpose computer workstation or a dedicated electronic layout design automation tool, which are preferably responsive to a computer program product comprising instructions for performing the steps described herein.

In particular, a method of synthesizing a computer readable representation of an integrated circuit with ESD circuit elements includes the steps of generating a representation of a first functional circuit element (e.g., logic gate) connected to a representation of a first input/output (I/O) pad, via a representation of a first electrical path, and generating a representation of a first ESD circuit element connected to the representation of the first input/output pad via a representation of a second electrical path which may overlap a portion of the first electrical path. These steps are then followed by the steps of determining first and second sheet resistances (or quantities related thereto) of the first and second electrical paths, respectively, and then adjusting a length and/or width of the representation of at least one of the first and second electrical paths if the first sheet resistance is greater than the second sheet resistance, so that the first sheet resistance is less than the second sheet resistance. The method also preferably includes the steps of visually displaying a schematic of the generated computer readable representation of the integrated circuit and then, if the first sheet resistance is greater than the second sheet resistance, repositioning the first electrostatic discharge protection circuit element and/or the second electrical path, relative to the first input/output pad, in the displayed schematic.

The apparatus for synthesizing the computer readable representation of the integrated circuit also contains hardware means or software means, including a computer program product, for performing the above described steps on a general purpose computer workstation or dedicated electronic layout design automation tool. In addition, the apparatus preferably contains means for retrieving computer readable representations of functional circuit elements, electrostatic discharge protection circuit elements and input/output pads from a storage device (e.g., memory). The storage device may also contain a programmed netlist of the integrated circuit. Means is also provided for updating the computer readable representation of the integrated circuit to contain the adjusted length and/or width of the representation of at least one of the first and second electrical paths.

The present invention also includes a method of correcting ESD and EOS ground rules faults in representations of integrated circuits containing functional circuit elements, power rails for providing current to and from the functional circuit elements, ESD circuit elements and input/output pads connected to respective ones of the functional circuit elements and ESD circuit elements. This method includes the steps of detecting a representation of a first electrical path in the representation of the integrated circuit, which extends between the representation of a first functional circuit element and a representation of a first input/output pad, and detecting a representation of a second electrical path extending between a first electrostatic discharge protection circuit element and the first input/output pad. Once the representations of the first and second electrical paths are detected, quantities relating to the sheet resistances of the first and second electrical paths are determined, based on circuit fabrication parameters including metal wiring and contact via resistance, and then the length and/or width of the representation of at least one of the first and second electrical paths is adjusted, if the first sheet resistance is greater than the second sheet resistance.

This method also includes the steps of detecting corners in representations of adjacent power rails where these representations have opposing edges separated by a minimum rail spacing, then adjusting a position of at least one of the power rails relative to the other so that the opposing edges are separated by a spacing which is no less than about two times the minimum rail spacing. The computer readable representation of the integrated circuit is then updated based on the adjusted position of at least one of the power rails. The apparatus for correcting electrostatic discharge and electrical overstress ground rules faults in the computer readable representation of the integrated circuit also contains hardware means or software means, including a computer program product, for performing the above described steps on a general purpose computer workstation or dedicated electronic layout design automation tool.

Accordingly, the method, apparatus and computer program product of the present invention are capable of synthesizing computer readable representations of integrated circuits containing ESD circuit elements and also correcting electrostatic discharge and electrical overstress ground rules faults therein which may be caused by, among other things, improper placement or wiring of ESD circuit elements or power rails.

DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
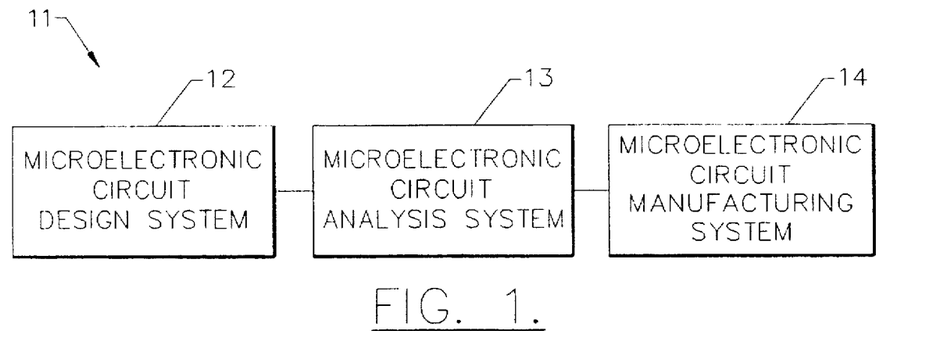
FIG. 1 illustrates a functional block diagram of a computer aided integrated circuit design, analysis and manufacturing system, according to the present invention.

Referring now to FIG. 1, a functional block diagram of a computer aided integrated circuit design, analysis and manufacturing system 11 is shown. The system includes three general subsystems: an integrated circuit design and layout system 12, an integrated circuit analysis and simulation system 13 and an integrated circuit fabrication and manufacturing system 14. The integrated circuit design and layout system 12 may include libraries of functional and electrostatic discharge protection (ESD) circuit elements, memory for containing netlists of integrated circuits and apparatus for performing the operations of the present invention described hereinbelow, including ground rules checking means for insuring that the resulting integrated circuit design meets the overall constraints and design ground rules that are compatible with the analysis system 13 and manufacturing system 14.

The integrated circuit design and layout system 12 is typically employed at the beginning of the design process to generate a computer readable representation of an integrated circuit which can be displayed as a schematic layout and verified for ground rules accuracy, operation and performance through means of the integrated circuit analysis and simulation system 13. After the performance of the integrated circuit is optimized using the integrated circuit analysis and simulation system 13, it is provided to an integrated circuit manufacturing system 14. The integrated circuit manufacturing system 14 may generate the required masks, and may control the manufacturing tools for performing the various processes on semiconductor wafers, and may perform other functions to produce integrated circuit chips.

It will be understood by those having skill in the art that the integrated circuit layout and design system 12, microelectronic circuit analysis and simulation system 13 and various parts of the integrated circuit manufacturing system 14 may be realized in whole or in part as software modules running on a computer system. Alternatively, a dedicated stand alone system may be provided. The general design and operation of systems 13 and 14 are well known to those having a skill in the art and need not be described further herein.

Figure 2:
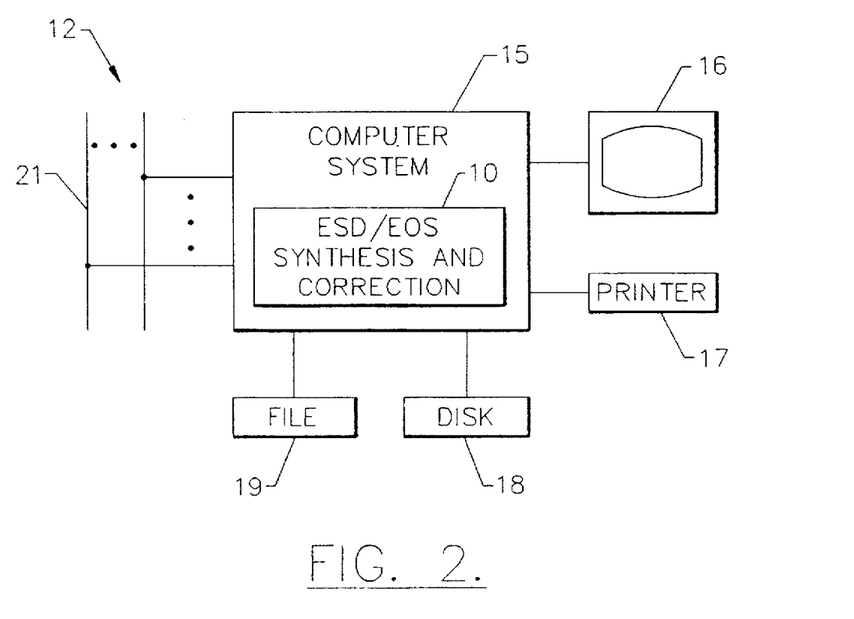
FIG. 2 illustrates a general hardware description of an integrated circuit design system according to the present invention.

Referring now to FIG. 2, a general hardware description of the integrated circuit design and layout system 12 of FIG. 1 will be described. As shown in FIG. 2, the design and layout system 12 preferably includes a computer 15 which may be a mainframe, minicomputer, workstation or a personal computer. The computer 15 may include a number of software subsystems running thereon. One such subsystem 10 synthesizes and corrects ESD and EOS ground rules faults according to the present invention. The design and layout system 12 may accept a netlist of an integrated circuit via a file 19 (e.g., SPICE input file), disk input 18, or via a data bus 21 which may also interface to the integrated circuit analysis system 13 (FIG. 1). A display 16 and printer 17 are also preferably provided to assist in the layout and design of the integrated circuit. The integrated circuit design may then be communicated to the integrated circuit analysis system 13 and integrated circuit manufacturing system 14 (FIG. 1) via the disk 18 or data bus 21. The hardware design of the above described components 16–19 and 21 of the integrated circuit analysis and simulation system 13 is well known to those having skill in the art and need not be described further. As one example, the integrated circuit layout, design, analysis and simulation systems of the present invention may be run on a computer system including a Sun Solaris™ workstation, HP-UX workstation or IBM RS-6000.

Figure 3:
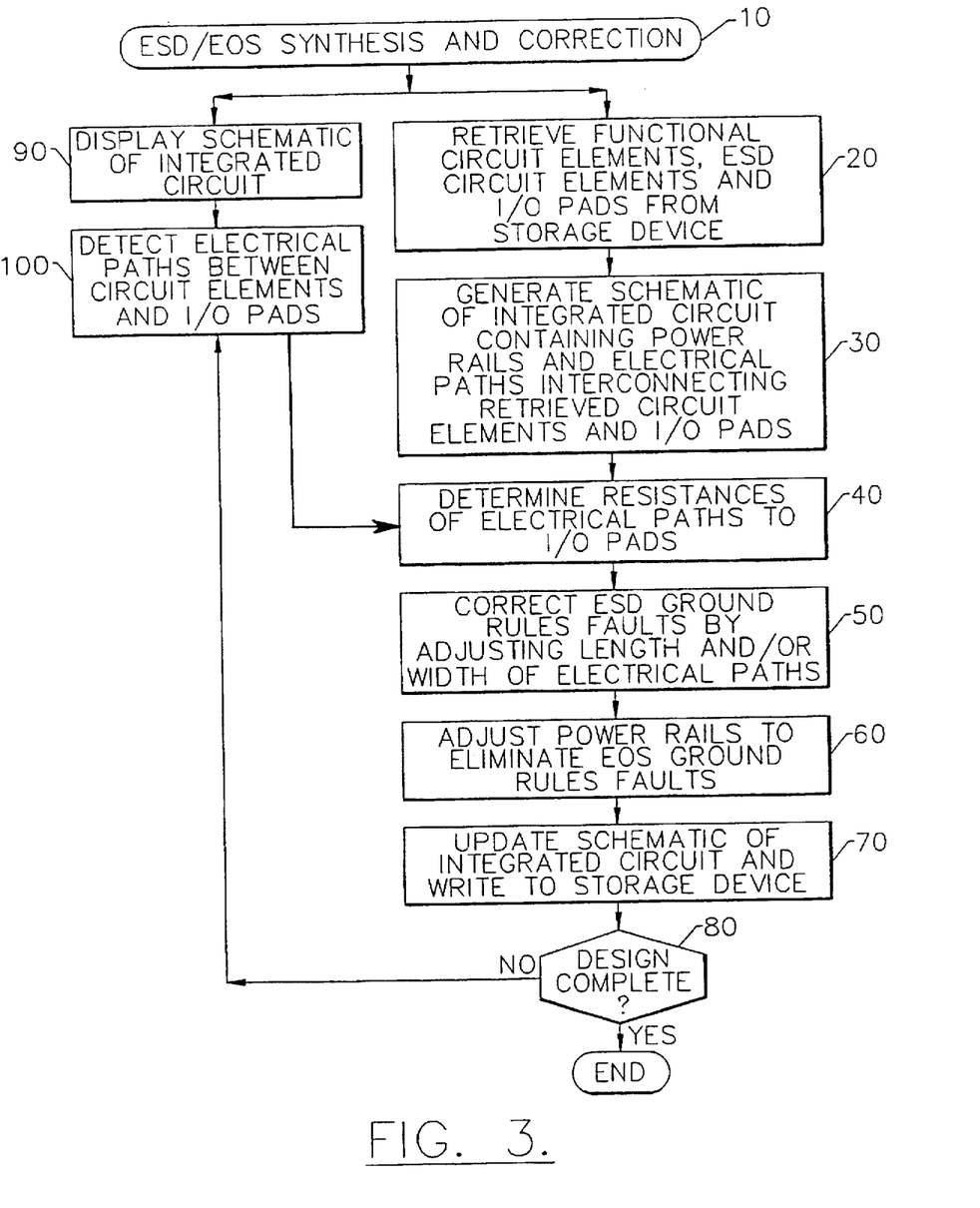
FIG. 3 illustrates operations performed by the integrated circuit design system, according to the present invention.

Referring now to FIG. 3, there is illustrated an overview of the operations performed by an apparatus 10 for synthesizing a computer readable representation of an integrated circuit with ESD circuit elements and correcting ESD and EOS ground rules faults in said representation. As shown, the operations comprise retrieving computer readable representations of functional circuit elements (e.g., transistors, logic gates, op-amps), ESD circuit elements/protection devices and I/O pads from a storage device and then generating and preferably displaying in two dimensions an electrical schematic of an integrated circuit containing representations of power rails for sourcing and sinking current to and from the circuit elements, and electrical paths (e.g., wiring) interconnecting the retrieved circuit elements and I/O pads, Blocks 20–30. These operations can be performed in response to a stored netlist of the integrated circuit or in response to commands from a user interactive computer-aided-design (CAD) tool containing a mouse and layout instruction selection menu, for example.

Next, operations are performed to determine quantities relating to the sheet resistances of the electrical paths interconnecting the ESD and functional circuit elements to respective I/O pads, Block 40. The length and/or widths of the electrical paths are then adjusted, if necessary, so that the resistance of the electrical path extending between an I/O pad and its respective ESD protection element is less than the resistance of the electrical path extending between the I/O pad and its respective functional circuit element, Block 50. An operation can also be performed to reduce the likelihood of occurrence of electrical overstress (EOS) faults across power rails. This is preferably achieved by adjusting the spacing between adjacent power rails wherever the presence of a corner in at least one of the rails is detected adjacent an edge or corner of another power rail and the spacing between the power rails is less than two times a predetermined minimum power rail spacing, Block 60.

After these adjustments are made, an updated representation of the integrated circuit is displayed and written to a memory or other storage device, Block 70. A check is then performed to determine if the entire integrated circuit has been checked for ESD and EOS ground rules faults, Block 80. If not, additional electrical paths between ESD and functional circuit elements and I/O pads are checked, Block 100, and then, as illustrated, the above described operations are repeated. As illustrated by Blocks 90–100 and Blocks 40–70, a complete schematic representation of an integrated circuit can be imported from an external storage device and checked for ESD and EOS ground rules faults. Thus, the present invention can be utilized during computer-aided-design (CAD) layout to confirm compliance with ESD and EOS ground rules and also after the layout is complete to confirm that the entire integrated circuit conforms to the ESD and EOS ground rules.

Figure 4A:
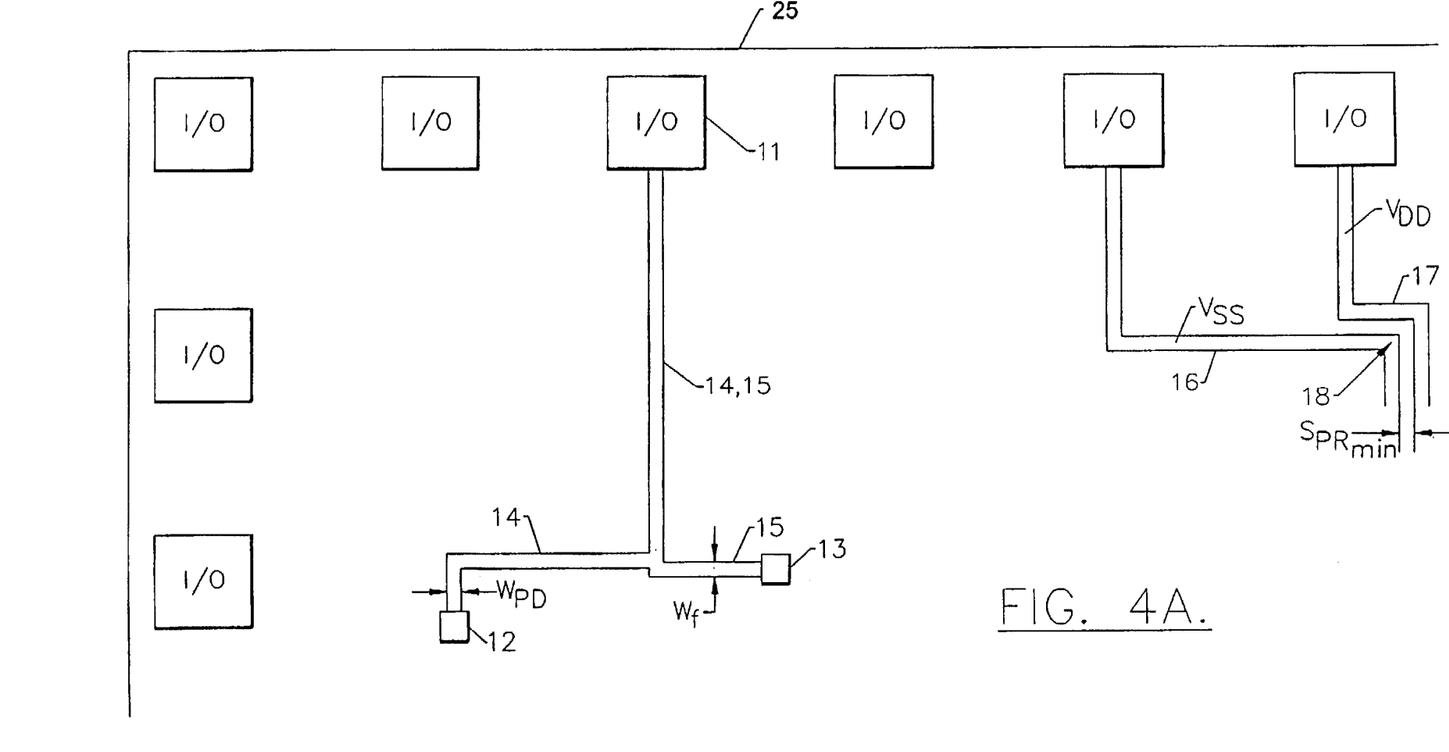
FIG. 4A illustrates a schematic layout of an integrated circuit prior to being corrected for EDS and EOS ground rules faults.
Figure 4B:
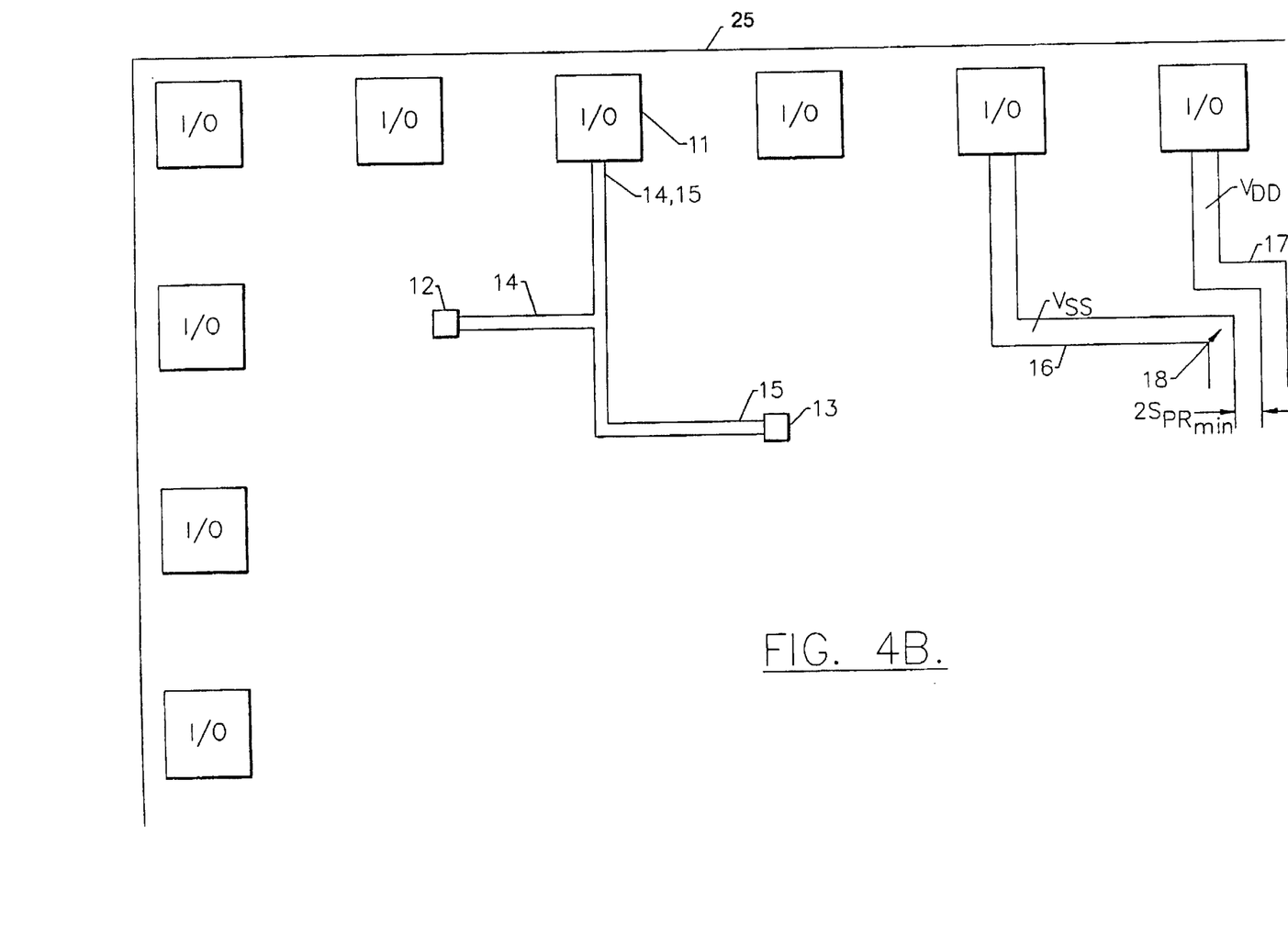
FIG. 4B illustrates a schematic layout of an integrated circuit after being corrected for EDS and EOS ground rules faults.

Referring now to FIGS. 4A–4B, a schematic layout of a chip 25 containing an I/O pad 11 which is electrically connected to an ESD circuit element/protection device 12 and functional circuit element 13, by respective electrical paths 14 and 15, is illustrated. As will be understood by those skilled in the art, ESD circuit elements/protection devices may include MOS transistors having built-in lateral parasitic bipolar transistors which become electrically conductive when an electrostatic or electrical overstress (ESD/EOS) condition is present at the I/O pad. Typical protection devices are described in U.S. Pat. Nos. 5,468,667, 5,450,267 and 5,404,041 to Diaz et al. and in U.S. Pat. Nos. 5,290,724 and 4,692,781 to Leach and Rountree et al., respectively, the disclosures of which are hereby incorporated herein by reference.

According to the present invention, the design, placement and wiring of the ESD protection device 12 and functional circuit element 13 should satisfy the condition: $L_{PD}/W_{PD} \ll L_F/W_F$, where $L_{PD}$ and $W_{PD}$ represent the length and width of the electrical wiring path 14 connecting the I/O pad 11 to the ESD protection device 12 and $L_F$ and $W_F$ represent the length and width of the electrical wiring path 15 connecting the I/O pad 11 to the functional circuit element 13. In the event this condition is not satisfied, the apparatus 10 detects an ESD ground rules fault and adjusts the length and/or width of at least one the electrical paths so that the condition is satisfied and the resistance of the path 14 connecting the ESD protection device 12 is less than the resistance of the path 15 connecting the functional circuit element 13.

In addition, it is also desireable to satisfy the additional condition: $V_{trigPD}+R_{on}I_{ESD}<V_{trigF}$, where $V_{trigPD}$ is the trigger voltage of the protection device 12, $V_{trigF}$ is the trigger voltage of the functional circuit element 13, $R_{on}$ is the on-resistance of the protection device and $I_{ESD}$ is the maximum ESD current which the protection device 12 is designed to withstand. The apparatus 10 also preferably detects EOS ground rules violations in the event minimum ground rules wiring spacings are present between power rails at sharp corners (e.g. 90°) and then readjusts the wiring spacings at the corners and/or rounds the corners so that the minimum separation is no less than two times the minimum ground rules wiring or power rail spacing. This inhibits the likelihood of electrical overstress (EOS) failures at the corners of adjacent power rails (e.g., $V_{dd}$ and $V_{ss}$).

In accordance with the above described apparatus 10, a preferred method of synthesizing a computer readable representation of an integrated circuit with ESD circuit elements includes the steps of generating a representation of a first functional circuit element 13 connected to a representation of a first input/output (I/O) pad 11, via a representation of a first electrical path 15, and generating a representation of a first ESD circuit element 12 connected to the representation of the first input/output pad 11 via a representation of a second electrical path 13. These steps are then followed by the steps of determining first and second sheet resistances (or quantities related thereto such as L/W) of the first and second electrical paths, respectively, and then adjusting a length and/or width of the representation of at least one of the first and second electrical paths if the first sheet resistance is greater than the second sheet resistance, so that the first sheet resistance is less than the second sheet resistance.

The method also preferably includes the steps of visually displaying a schematic of the generated computer readable representation of the integrated circuit and then, if the first sheet resistance is greater than the second sheet resistance, repositioning the first electrostatic discharge protection circuit element 12 and/or the second electrical path 14, relative to the first input/output pad 11, in the displayed schematic.

The apparatus 10 for synthesizing the computer readable representation of the integrated circuit also contains hardware means and/or software means, including a computer program product (e.g., floppy disk), for performing the above described steps on a general purpose computer workstation or dedicated electronic layout design automation tool. In addition, the apparatus 10 preferably contains means for retrieving computer readable representations of the first functional circuit element 13, the first electrostatic discharge protection circuit element 12 and the first input/output pad 11 from a storage device (e.g., memory) which may also contain a programmed netlist of the integrated circuit. Means is also provided for updating the computer readable representation of the integrated circuit to contain the adjusted length and/or width of the representation of at least one of the first and second electrical paths.

The method of the present invention also includes the steps of correcting ESD and EOS ground rules faults in representations of integrated circuits containing functional circuit elements, first and second power rails 16 and 17 for providing current to and from the functional circuit elements, ESD circuit elements and input/output pads connected to respective ones of the functional circuit elements and ESD circuit elements. The steps include detecting a representation of a first electrical path 15 in the representation of the integrated circuit, which extends between the representation of a first functional circuit element 13 and a representation of a first input/output pad 11, and detecting a representation of a second electrical path extending between a first electrostatic discharge protection circuit element and the first input/output pad. Once the representations of the first and second electrical paths are detected, quantities relating to the first sheet resistance and the second sheet resistance of the representations of the first and second electrical paths are determined and then the length and/or width of the representation of at least one of the first and second electrical paths is adjusted, if the first sheet resistance is greater than the second sheet resistance.

The preferred steps also include detecting a corner 18 in one of the representations of the first and second power rails 16 and 17 where these representations have opposing edges separated by a minimum power rail spacing ("$S_{PRmin}$"), then adjusting a position of at least one of the representations of the first and second power rails relative to the other so that the opposing edges are separated by a spacing which is no less than about two times the minimum rail spacing ("$2S_{PRmin}$"). The computer readable representation of the integrated circuit is then updated based on the adjusted position of at least one of the power rails. The apparatus for correcting electrostatic discharge ground rules faults in the computer readable representation of the integrated circuit also contains hardware means and/or software means, including a computer program product, for performing the above described steps on a general purpose computer workstation or dedicated electronic layout design automation tool.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of synthesizing a computer readable representation of an integrated circuit with electrostatic discharge protection capability, comprising the steps of:

generating a computer readable representation of an integrated circuit containing a representation of a first functional circuit element connected to a representation of a first input/output pad, via a representation of a first electrical path, and a representation of a first electrostatic discharge protection circuit element connected to the representation of the first input/output pad, via a representation of a second electrical path;

determining a quantity relating to a first sheet resistance of the representation of the first electrical path and determining a quantity relating to a second sheet resistance of the representation of the second electrical path; and adjusting a length and/or width of the representation of at least one of the first and second electrical paths to improve the electrostatic discharge capability of the integrated circuit, if the first sheet resistance is greater than the second sheet resistance; and wherein the first electrostatic discharge protection circuit element is characterized by a trigger voltage ($V_{trigPD}$), an on-resistance ($R_{on}$) and a maximum ESD current $I_{ESD}$; wherein the first functional circuit element is characterized by a trigger voltage ($V_{trigF}$); and wherein $V_{trigPD} + R_{on} I_{ESD} < V_{trigF}$.

2. The method of claim 1, further comprising the step of updating the computer readable representation of the integrated circuit with the adjusted length and/or width of the representation of at least one of the first and second electrical paths.

3. The method of claim 2, further comprising the step of visually displaying a schematic of the generated computer readable representation of the integrated circuit in at least two dimensions.

4. The method of claim 3, further comprising the step of repositioning the first electrostatic discharge protection circuit element and/or the second electrical path relative to the first input/output pad, in the displayed schematic, if the first sheet resistance is greater than the second sheet resistance.

5. An apparatus for synthesizing a computer readable representation of an integrated circuit with electrostatic discharge protection capability, comprising:

means for generating a computer readable representation of an integrated circuit containing a representation of a first functional circuit element connected to a representation of a first input/output pad, via a representation of a first electrical path, and a representation of a first electrostatic discharge protection circuit element connected to the representation of the first input/output pad, via a representation of a second electrical path, said first electrostatic discharge protection circuit element characterized by a trigger voltage ($V_{trigPD}$), an on-resistance ($R_{on}$) and a maximum ESD current $I_{ESD}$ and said first functional circuit element characterized by a trigger voltage ($V_{trigF}$); and wherein $V_{trigPD} + R_{on} I_{ESD} < V_{trigF}$;

means, responsive to said generating means, for determining a quantity relating to a first sheet resistance of the representation of the first electrical path and determining a quantity relating to a second sheet resistance of the representation of the second electrical path; and means, responsive to said quantity determining means, for adjusting a length and/or width of the representation of at least one of the first and second electrical paths to improve the electrostatic discharge capability of the integrated circuit, if the first sheet resistance is greater than the second sheet resistance.

* * * * *

UNITED STATES PATENT AND TRADEMARK OFFICE
CERTIFICATE OF CORRECTION

PATENT NO. : 5,796,638
DATED : August 18, 1998
INVENTOR(S) : Kang et al.

It is certified that error appears in the above-identified patent and that said Letters Patent is hereby corrected as shown below:

In the Title:
Please delete "CONNECTING" and substitute -- CORRECTING -- therefor.

[56] References Cited - Other Publications
Lowther et al.    Delete "Quan" and substitute -- Quasi -- therefor.

Signed and Sealed this

Tenth Day of August, 1999

Attest:

Q. TODD DICKINSON

Attesting Officer

Acting Commissioner of Patents and Trademarks